(12) United States Patent
Wu et al.

(10) Patent No.: US 8,089,062 B2
(45) Date of Patent: Jan. 3, 2012

(54) WAX ENCAPSULATED ELECTRONIC DEVICES

(75) Inventors: Yiliang Wu, Mississauga (CA); Beng S. Ong, Mississauga (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 576 days.

(21) Appl. No.: 11/087,881

(22) Filed: Mar. 23, 2005

(65) Prior Publication Data

US 2006/0214312 A1 Sep. 28, 2006

(51) Int. Cl.
*H01L 35/24* (2006.01)
*H01L 51/00* (2006.01)

(52) U.S. Cl. .................. 257/40; 257/E51.001

(58) Field of Classification Search .............. 257/40, 257/E51.001
See application file for complete search history.

(56) References Cited

U.S. PATENT DOCUMENTS

| | | | |
|---|---|---|---|
| 4,572,853 A * | 2/1986 | Ikeya et al. ................. 428/76 |
| 5,597,738 A * | 1/1997 | Kurtz et al. ................. 438/154 |
| 5,619,357 A | 4/1997 | Angelopoulos et al. ....... 349/110 |
| 5,631,753 A * | 5/1997 | Hamaguchi et al. .......... 349/110 |
| 5,660,738 A * | 8/1997 | Hunter et al. ............... 216/17 |
| 5,739,186 A * | 4/1998 | Hayakawa et al. ............ 523/443 |
| 5,777,070 A | 7/1998 | Inbasekaran et al. ......... 528/394 |
| 5,969,376 A | 10/1999 | Bao ................................ 257/40 |
| 6,107,117 A | 8/2000 | Bao et al. ...................... 438/99 |
| 6,150,191 A | 11/2000 | Bao .............................. 438/99 |
| 6,621,099 B2 | 9/2003 | Ong et al. ..................... 257/40 |
| 6,770,904 B2 | 8/2004 | Ong et al. ..................... 257/40 |
| 6,777,529 B2 | 8/2004 | Ong et al. ..................... 528/373 |
| 6,864,504 B2 * | 3/2005 | Breen et al. ................... 257/40 |
| 2001/0018157 A1 * | 8/2001 | Aoki et al. ................... 430/109.4 |
| 2003/0108664 A1 * | 6/2003 | Kodas et al. .................. 427/125 |
| 2003/0160234 A1 | 8/2003 | Ong et al. ..................... 257/40 |
| 2003/0166829 A1 | 9/2003 | Ong et al. ..................... 528/394 |
| 2003/0171531 A1 | 9/2003 | Ong et al. ..................... 528/373 |
| 2005/0084788 A1 * | 4/2005 | Yau et al. ...................... 430/138 |
| 2005/0196972 A1 * | 9/2005 | Eder et al. .................... 438/778 |
| 2006/0132895 A1 * | 6/2006 | Miyazaki ...................... 359/296 |
| 2006/0180805 A1 * | 8/2006 | Lutz et al. ..................... 257/40 |
| 2006/0279908 A1 * | 12/2006 | Omori et al. .................. 361/528 |

* cited by examiner

*Primary Examiner* — Kenneth Parker
*Assistant Examiner* — Anthony Ho
(74) *Attorney, Agent, or Firm* — Fay Sharpe LLP (57) ABSTRACT

An electronic device comprising: a substrate, an active layer, and an encapsulating layer comprising at least one wax.

20 Claims, 2 Drawing Sheets

WAX ENCAPSULATED ELECTRONIC DEVICES

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in this invention.

CROSS-REFERENCE TO RELATED APPLICATIONS

Illustrated in copending applications U.S. Ser. No. 10/042,342, Publication No. 2003/0160234; U.S. Ser. No. 10/042,357, Publication No. 2003/0171531; and U.S. Ser. No. 10/042,360, Publication No. 2003/0166829, the disclosures of which are totally incorporated herein by reference, all titled "Polythiophenes and Devices Thereof" and all filed Jan. 11, 2002; and also illustrated in U.S. Pat. No. 6,621,099, U.S. Pat. No. 6,770,904 and U.S. Pat. No. 6,777,529 are polythiophenes and devices thereof.

The appropriate components, processes thereof and uses thereof illustrated in these copending applications may be selected for the present disclosure in embodiments thereof.

BACKGROUND

The present disclosure is generally directed to devices that are encapsulated, and in embodiments contain polythiophenes. More specifically, the present disclosure in embodiments is directed to thin film transistors and similar electronic devices that contain a protective layer of a wax, and for example, polythiophenes, such as those illustrated in the above copending patent applications, including those polythiophenes containing repeating thienylene units having side chains, such as alkyl, which are arranged in a regioregular manner on the polythiophene backbone, and which polythiophenes are, for example, useful as active semiconductive materials for thin film field-effect transistors (FETs).

Recently, there has been reported to, for example, attempt to achieve economical devices, a number of organic electronic devices, such as organic thin film transistors (OTFTs), containing organic materials, such as organic conductors, organic semiconductors and organic dielectric materials on flexible substrates. Unfortunately, the lifetime of a number of organic electronic devices is usually short when the devices are exposed to ambient conditions in view of certain interactions of the organic semiconductor layer with the ambient oxygen, moisture, and light causing degradation and/or doping of the semiconductor materials. Thus, to attempt to achieve long operable lifetime devices, the semiconductor layers in the thin film transistor (TFT) devices should be protected from the environment.

To stabilize the organic devices from environmental moisture, oxygen, and ambient light, the present disclosure envisions an encapsulation material that is hydrophobic, density-packed, and light scattering; a solution coatable or jettable material for fabricating a protecting layer for compatibility, mechanical, and manufacturing cost considerations. A number of materials are known for encapsulation of organic electronic devices, particularly organic thin film transistor, such as silicon oxide, poly(vinyl alcohol) (PVA), poly(vinyl phenol) (PVP), and PMMA have been reported for use as protective encapsulation materials for TFTs. Silicon oxide usually involves vacuum deposition, thus, it is not considered as being suitable with a number of OTFTs (organic thin film transistors) fabricated by solution coating or jet printing processes. PVA and PVP are hydrophilic and over time absorb moisture from the air and degrade TFT performance. PMMA is amorphous and may not effectively block environmental oxygen from entering the devices. For long term OTFT stability, a hydrophobic, oxygen and visible light-blocking protective encapsulation layer is needed.

Semiconductive polymers like certain polythiophenes, which are useful as active semiconductor materials in thin film transistors (TFTs), have been reported. A number of these polymers have some solubility in organic solvents and are thus able to be fabricated as semiconductor channel layers in TFTs by solution processes, such as spin coating, solution casting, dip coating, screen printing, stamp printing, jet printing and the like. Their ability to be fabricated via common solution processes would render their manufacturing simpler and cost effective as compared to the costly conventional photolithographic processes typical of silicon-based devices, such as hydrogenated amorphous silicon TFTs. Moreover, desired are transistors fabricated with polymer materials, such as polythiophenes, referred to as polymer TFTs with excellent mechanical durability and structural flexibility, which may be highly desirable for fabricating flexible TFTs on plastic substrates. Flexible TFTs would enable the design of electronic devices which usually require structural flexibility and mechanical durability characteristics. The use of plastic substrates together with organic or polymer transistor components can transform the traditionally rigid silicon TFT into a mechanically more durable and structurally flexible polymer TFT design. The latter is of particular value to large area devices, such as large area image sensors, electronic paper, and other display media. Also, the selection of polymer TFTs for integrated circuit logic elements for low end microelectronics, such as smart cards, radio frequency identification (RFID) tags, and memory/storage devices, may also greatly enhance their mechanical durability, and thus their useful life span. Nonetheless, many of the semiconductor polythiophenes are not, it is believed, stable when exposed to air as they become oxidatively doped by ambient oxygen, resulting in increased conductivity. The result is larger off-current and thus lower current on/off ratio for the devices fabricated from these materials. Accordingly, with many of these materials, rigorous precautions have to be undertaken during materials processing and device fabrication to exclude environmental oxygen to avoid or minimize oxidative doping. These precautionary measures add to the cost of manufacturing therefore offsetting the appeal of certain polymer TFTs as an economical alternative to amorphous silicon technology, particularly for large area devices. Additionally, the electronic devices need protection from oxygen, as indicated herein, moisture, light, and the like. These and other disadvantages are avoided or minimized in embodiments of the present disclosure, and wherein in embodiments there is selected a wax coating, and which wax can be hydrophobic and with suitable crystalline characteristics, and further which wax can be solution coatable and ink jet printable thereby avoiding/minimizing the limitations of certain inorganic coatings, such as silicon oxide which is applied by vacuum deposition processes.

REFERENCES

A number of organic semiconductor materials has been described for use in field-effect TFTs, which materials include organic small molecules, such as pentacene, see for example D. J. Gundlach et al., "Pentacene organic thin film transistors—molecular ordering and mobility", *IEEE Electron Device Lett.*, Vol. 18, page 87 (1997), to oligomers such as sexithiophenes or their variants, see for example reference F. Garnier et al., "Molecular engineering of organic semiconductors: Design of self-assembly properties in conjugated thiophene oligomers", *Amer. Chem. Soc., Vol.* 115, page 8716 (1993), and certain polythiophenes, such as poly(3-alkylthiophene), see for example reference Z. Bao et al., "Soluble and processable regioregular poly(3-hexylthiophene) for field-effect thin film transistor application with high mobility", *Appl. Phys. Lett.*, Vol. 69, page 4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low end microelectronics such as smart cards and RFID tags. TFTs fabricated from organic or polymer materials may be functionally and structurally more desirable than conventional silicon technology in the aforementioned areas in that they may offer mechanical durability, structural flexibility, and the potential of being able to be incorporated directly onto the active media of the devices, thus enhancing device compactness for transportability. However, most small molecule or oligomer-based devices rely on difficult vacuum deposition techniques for fabrication. Vacuum deposition is selected primarily because the small molecular materials are either insoluble or their solution processing by spin coating, solution casting, or stamp printing do not generally provide uniform thin films. In addition, vacuum deposition may also involve the difficulty of achieving consistent thin film quality for large area format. Polymer TFTs, such as those fabricated from regioregular polythiophenes of, for example, regioregular poly(3-alkylthiophene-2,5-diyl) by solution processes, while offering some mobility, suffer from their propensity towards oxidative doping in air. For practical low cost TFT design, it is, therefore, of value to have a semiconductor material that is both stable and solution processable, and where its performance is not adversely affected by ambient oxygen, for example regioregular polythiophenes, such as poly(3-alkylthiophene-2,5-diyl) are very sensitive to air. The TFTs fabricated from these materials in ambient conditions generally exhibit very large off-current, very low current on/off ratios, and their performance characteristics degrade rapidly.

References that may be of interest include U.S. Pat. Nos. 6,150,191; 6,107,117; 5,969,376; 5,619,357, and 5,777,070.

FIGURES

Illustrated in FIGS. 1 to 4 are various representative embodiments of the present disclosure and wherein at least one functions as a protection layer, and wherein polythiophenes may be selected as the channel materials in thin film transistor (TFT) configurations.

SUMMARY

It is a feature of the present disclosure to provide electronic devices comprising
a substrate;
an active layer;
an encapsulation layer, and wherein the encapsulation layer comprises a wax composition.

It is another feature of the present disclosure to provide a thin film transistor comprising
a substrate;
a gate electrode;
a semiconductor layer;
a gate dielectric layer;
a source electrode;
a drain electrode;
and an encapsulation layer wherein the gate dielectric layer, the gate electrode, the semiconductor layer, the source electrode, and the drain electrode are in any suitable affective sequence providing, for example, that the gate electrode and the semiconductor layer both contact the gate dielectric layer, and the source electrode and the drain electrode both contact the semiconductor layer, wherein the encapsulation layer comprises a wax composition.

In yet a further feature of the present disclosure there are provided methods comprising
providing an electronic device having an active layer; and
depositing an encapsulation layer of a wax composition on the electronic device to separate the electronic device from its environment.

It is a feature of the present disclosure to provide substantially stable encapsulated microelectronic devices such as TFT devices.

It is another feature of the present disclosure to provide encapsulated thin film transistors containing polythiophenes with a band gap of from about 1.5 eV to about 3 eV as determined from the absorption spectra of thin films thereof, and which polythiophenes are suitable for use as TFT semiconductor channel layer materials, and wherein the devices contain a wax coating.

Also, in yet another feature of the present disclosure there are provided wax coated polythiophene devices, and which devices exhibit enhanced resistance to the adverse effects of oxygen, that is, these devices exhibit relatively high current on/off ratios, and their performance does not substantially degrade as rapidly as similar devices free of encapsulation and fabricated from regioregular polythiophenes, such as regioregular poly(3-alkylthiophene-3,5-diyl), and wherein the wax functions primarily as a protective layer; and wherein the wax is a hydrophobic component, a highly crystalline material, colorant or dye incorporated wax, such as inks and the like, wherein these components respectfully function as humidity control agents, oxygen blockers, and absorb visible light.

Aspects of the present disclosure include an electronic device comprising a substrate, an active layer, and an encapsulating layer comprising at least one wax; a thin film transistor comprising
a substrate;
a gate electrode;
a semiconductor layer;
a gate dielectric layer;
a source electrode;
a drain electrode;
and layer thereover comprising a wax and optional additives wherein the gate dielectric layer, the gate electrode, the semiconductor layer, the source electrode, and the drain electrode are in any sequence providing that said gate electrode and said semiconductor layer both contact the gate dielectric layer, and the source electrode and the drain electrode both contact the semiconductor layer; a thin film transistor comprised of a substrate, an active polythiophene layer, and which layer is in contact with a wax; and wherein active layer refers, for example, to the layer which may change its electric properties when it is exposed to light, moisture, oxygen, possible chemicals, and the combination of them. For example, the organic semiconductor layer in a thin film transistor device may be photo-oxidized when exposed to ambient light and oxygen, which results in lower device performance, for instance, lower mobility and lower current on/off ratio. To maintain the electric properties, the active layer in accordance with the present disclosure is "isolated" from its environment, such as for example, ambient light, oxygen, moisture, possible chemicals, and the mixture of them by an encapsulating wax composition, which wax composition is usually in contact with the active layer of the electronic device and wherein the wax encapsulation layer possesses, for example, a thickness of from about 100 nanometers to about 10 micrometers, or from about 300 nanometers to about 2 micrometers.

Aspects of the present disclosure relate to an electronic device containing a wax coating in contact with a polythiophene active layer wherein the polythiophene is of the formula/structure wherein R represents a side chain, m represents the number of R substituents; A is a divalent linkage; x, y and z represent, respectively, the number of $R_m$ substituted thienylenes, unsubstituted thienylenes, and divalent linkages A, respectively, in the monomer segment subject to z being 0 or 1, and n represents the number of repeating monomer segments in the polymer or the degree of polymerization; a device which is a thin film transistor (TFT) comprised of a substrate, a gate electrode, a gate dielectric layer, a source electrode and a drain electrode, and in contact with the source/drain electrodes and the gate dielectric layer semiconductor a layer comprised of polythiophene wherein R is alkoxyalkyl, siloxy-substituted alkyl, a perhaloalkyl, or a polyether; A is a divalent linkage selected from the group consisting of arylene of about 6 to about 40 carbon atoms; m is 1 or 2; x and y are the number of the R substituted thienylenes and the unsubstituted thienylene moieties, respectively, each of which are from 1 to about 5; z is zero or 1, and represents the number of divalent linkages; and n represents the number of monomer segments; a device wherein n is from about 5 to about 5,000; the number average molecular weight ($M_n$) of the polythiophene is from about 2,000 to about 100,000; the weight average molecular weight ($M_w$) is from about 4,000 to over 500,000, both $M_w$ and $M_n$ being measured by gel permeation chromatography using polystyrene standards; a device wherein R is alkyl containing from 1 to about 20 carbon atoms, and wherein n is from about 10 to about 1,000; the $M_n$ is from about 4,000 to about 50,000; and the $M_w$ is from about 5,000 to about 100,000; a device wherein the alkyl side chain R contains from about 6 to about 12 carbon atoms; a device wherein the alkyl side chain R is butyl, pentyl, hexyl, heptyl, octyl, nonyl, decyl, undecyl, or dodecyl; a device wherein the side chain R is a perfluoroalkyl of about 2 to about 15 carbon atoms; a device wherein the side chain R is siloxyalkyl of trimethylsiloxyalkyl, triethylsiloxyalkyl, and wherein alkyl optionally contains from about 4 to about 10 carbons, and which alkyl is butyl, pentyl, hexyl, heptyl, or octyl; a device wherein the divalent linkage A is an arylene with from about 6 to about 40 carbon atoms; a TFT device wherein the divalent linkage A is selected from the group consisting of phenylene, biphenylene, phenanthrenylene, 9,10-dihydrophenanthrenylene, fluorenylene, methylene, polymethylene, dioxyalkylene, dioxyarylene, and oligoethylene oxide; a thin film transistor containing the following polythiophene active layer, and thereover a wax or waxes wherein R is a side chain; a, b, c, and d represent the number of thienylene moieties; and n is the degree of polymerization; a device wherein R is alkyl containing from about 1 to about 20 carbon atoms; a device wherein R is alkyl containing from about 6 to about 12 carbon atoms; a device wherein R is butyl, pentyl, hexyl, heptyl, octyl, nonyl, decyl, undecyl, or dodecyl; a device wherein b and d are from about 1 to about 5; a device wherein b and d are from about 1 to about 3; a device wherein a is from about 0 to about 5, and c is about 1 to about 5, or wherein a is about 0 to about 3, and c is about 1 to about 3; a thin film transistor containing a polythiophene coated with or encapsulated with a known wax, and which polythiophene is represented by following the alternative Formula (IV)

wherein the substituents like a, b, c, d are as illustrated herein; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate is a dielectric layer comprised of silicon nitride or silicon oxide; a TFT device wherein the substrate is glass or a plastic sheet; said gate, source and drain electrodes are each comprised of gold, and the gate dielectric layer is comprised of the organic polymer poly(methacrylate), or poly(vinyl phenol); a device wherein the wax coated polythiophene layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene) or from a conductive ink/paste compound of a colloidal dispersion of silver in a polymer binder, and the gate dielectric layer is organic polymer or inorganic oxide particle-polymer composite; device or devices include electronic devices such as TFTs.

There are disclosed in embodiments coated or wax encapsulated electronic devices thereof. More specifically, the present disclosure relates to wax coated thin film transistors containing polythiophenes illustrated by or encompassed by the copending applications recited herein, and yet more specifically, of Formula (I)

(I)

wherein, for example, R is a side chain comprising, for example, alkyl, alkyl derivatives, such as alkoxyalkyl; siloxy-substituted alkyl, perhaloalkyl, such as a perfluoro, polyether, such as oligoethylene oxide, polysiloxy, and the like; A is a divalent linkage selected, for example, from the group consisting of arylene, such as phenylene, biphenylene, phenanthrenylene, dihydrophenanthrenylene, fluorenylene, oligoarylene, methylene, polymethylene, dialkylmethylene, dioxyalkylene, dioxyarylene, oligoethylene oxide, and the like; m is the number of side chains, for example 1 or 2; x and y are the numbers of the R substituted thienylenes and the non-substituted thienylene moieties, respectively; and z is the number of divalent linkages and is usually 0 or 1; the relative positions of the R substituted and nonsubstituted thienylene moieties, and the divalent linkage; and n represents the number of segments. A in the monomer segment may be different from those presented in Formula (I), that is for example, polythiophenes (I)

(II)

schematically represented by Formula (II) as semiconductor layers in TFT devices wherein R is a side chain comprised of, for example, alkyl, alkyl derivatives, such as alkoxyalkyl, siloxy-substituted alkyl, perhaloalkyl, such as perfluoro, polyether, such as oligoethylene oxide, polysiloxy derivatives, and the like; a is an integer (or number) of from about 0 to about 5; b, c, and d are integers of from about 1 to about 5; and n is the degree of polymerization, and can be from about 5 to over 5,000, and more specifically, from about 10 to about 1,000 wherein the number average molecular weight ($M_n$) of the polythiophenes can be, for example, from about 2,000 to about 100,000, and more specifically, from about 4,000 to about 50,000, and the weight average molecular weight ($M_w$) thereof can be from about 4,000 to about 500,000, and more specifically, from about 5,000 to about 100,000 both as measured by gel permeation chromatography using polystyrene standards. Examples of the side chains for the polythiophenes (I) and (II) include alkyl with, for example, from about 1 to about 25, and more specifically, from about 4 to about 12 carbon atoms, and yet more specifically, from about 12 to about 18 carbon atoms (included throughout are numbers within the range, for example 4, 5, 6, 7, 8, 9, 10, 11 and 12), such as butyl, pentyl, hexyl, heptyl, octyl, nonyl, decyl, undecyl, dodecyl, isomeric forms thereof, mixtures thereof, and the like; alkoxyalkyl with, for example, from about 2 to about 30 carbon atoms, such as for example methoxypropyl, methoxybutyl, methoxypentyl, methoxyhexyl, methoxyheptyl, and the like, polyether chains, such as polyethylene oxide; perhaloalkyl, such as perfluoroalkyl, polysiloxy chain, such as trialkylsiloxyalkyl derivatives, and the like.

Specific illustrative polythiophene examples are illustrated in the copending applications recited hereinbefore, and more specifically, wherein n is as illustrated herein, that is n represents a number that enables repeating segments.

(II-g)

(II-h)

(II-g)

(II-f)

(II-k)

(II-l)

(II-m)

(II-n)

(II-o)

The polythiophenes in embodiments are soluble in common coating solvents, for example, in embodiments they possess a solubility of at least about 0.1 percent by weight, and more specifically, from about 0.5 percent to about 5 percent by weight in such solvents as methylene chloride, 1,2-dichloroethane, tetrahydrofuran, toluene, xylene, mesitylene, chlorobenzene, and the like. Moreover, the polythiophenes of the present disclosure in embodiments when fabricated as semiconductor channel layers in TFT devices provide a stable conductivity of, for example, from about $10^{-9}$ S/cm to about $10^{-5}$ S/cm, and more specifically, from about $10^{-8}$ S/cm to about $10^{-6}$ S/cm as determined by conventional four-probe conductivity measurements. The polythiophenes can be prepared by any suitable method. The preparation of polythiophenes in copending applications recited hereinbefore are totally incorporated herein by reference.

Examples of waxes of the present disclosure, such as crystalline or semicrystalline waxes, include, for example, natural vegetable waxes, natural animal waxes, mineral waxes, synthetic waxes, functionalized waxes, and the like. More specifically, the wax composition contains, for example, from about 10 to about 100 percent of the wax component by weight and wherein the encapsulating wax is selected from natural vegetable waxes, natural animal waxes, mineral waxes, synthetic waxes, functionalized waxes, and mixtures thereof. Examples of natural vegetable waxes include, for example, carnauba wax, candelilla wax, Japan wax, and bayberry wax. Examples of natural animal waxes include, for example, beeswax, punic wax, lanolin, lac wax, shellac wax, and spermaceti wax. Mineral waxes include, for example, paraffin wax, microcrystalline wax, montan wax, ozokerite wax, ceresin wax, petrolatum wax, and petroleum wax. Synthetic waxes include, for example, Fischer-Tropsch wax, acrylate wax, fatty acid amide wax, silicone wax, polytetrafluoroethylene wax, polyethylene wax, and polypropylene wax, and mixtures thereof. For example, synthetic waxes are the waxes generated from the known Fischer-Tropsch synthesis in which either coal or natural gas derived carbon monoxide is combined with hydrogen to produce hydrocarbons, followed by the polymerization of ethylene to produce waxes and polymers. In embodiments, the waxes are crystalline and semicrystalline in nature. Crystallinity of the wax composition can be verified by conventional characterization techniques such as X-ray diffraction measurements.

Examples of waxes of embodiments include polypropylenes and polyethylenes commercially available from Allied Chemical and Baker Petrolite, VISCOL 550-P™, a low weight average molecular weight polypropylene available from Sanyo Kasei K.K., and similar materials. The commercially available polyethylenes usually possess a molecular weight $M_w$ of from about 500 to about 25,000, while the commercially available polypropylenes utilized have a molecular weight of about 4,000 to about 5,000. Examples of functionalized waxes include waxes comprising functional groups of amines, amides, imides, esters, quaternary amines, chloride, carboxylic acids, or mixture thereof, for example, JONCRYL™ 74, 89, 130, 537, and 538, all available from Johnson Diversey, Inc., chlorinated polypropylenes and polyethylenes commercially available from Allied Chemical and Petrolite Corporation and Johnson Diversey, Inc. Many of the polyethylene and polypropylene compositions useful in embodiments are illustrated in British Patent No. 1,442,835, the entire disclosure of which is incorporated herein by reference.

In embodiments wherein the wax is a polyethylene wax, the wax may have a weight average molecular weight ($M_w$) of about 500 to about 25,000, or of about 500 to about 7,000, a number average molecular weight ($M_n$) of about 400 to about 20,000, or of about 500 to about 5,500, a melting temperature of about 70° C. to about 130° C., or of about 80° C. to about 110° C.

The ratio of two waxes, at least one wax refers, for example, to one wax to about seven waxes, or more specifically, from about two to about five waxes, may be from about 1:99 to about 99:1, about 10:90 to about 90:10, or about 25:75 to about 75:25, where the ratio is a weight ratio or a volume ratio. For more than two waxes, each wax can be present or selected in various suitable amounts, such as from about 1 to about 95, from about 5 to about 50, and the like weight percent.

The wax composition may contain light absorbing pigments, dyes or mixtures thereof wherein the pigments or dyes are present in an amount of from about 0.1 to about 30 percent by weight of the wax composition, or from about 1 to about 10 percent by weight of the wax composition. As light can cause photodegradation of the active layer in the electronic devices, the pigments or dyes selected may have similar or broader absorption windows than that of the active layer. Also, the pigments or dyes may have strong absorption characteristics in the ultraviolet regime, where light therefrom has high energy which may also cause degradation of the active layer.

Illustrative examples of pigments or dyes present, for example, in suitable amounts of from about 1 to about 25 percent by weight include, but are not limited to, black, cyan, magenta, yellow, red, green, brown, blue pigments or dyes, and/or mixtures thereof. Specific examples of pigments or dyes in the wax composition include, but are not limited to, SUNSPERSE 6000™, FLEXIVERSE™, phthalocyanine HELIOGEN BLUE L6900™, D6840™, D7080™, D7020™, PYLAM OIL BLUE™, PYLAM OIL YELLOW™, PIGMENT BLUE 1™, available from Paul Uhlich & Company, Inc., PIGMENT VIOLET 1™, PIGMENT RED 48™, LEMON CHROME YELLOW DCC 1026™, E.D. TOLUIDINE RED™ and BON RED C™ available from Dominion Color Corporation, Ltd., Toronto, Ontario, NOVAPERM YELLOW FGL™, HOSTAPERM PINK E™ from Hoechst, CINQUASIA MAGENTATA™ available from E.I. DuPont de Nemours & Company, Pigment Yellow 180, Pigment Yellow 12, Pigment Yellow 13, Pigment Yellow 14, Pigment Yellow 17, Pigment Blue 15, Pigment Blue 15:3, Pigment Red 122, Pigment Red 57:1, Pigment Red 81:1, Pigment Red 81:2, Pigment Red 81:3, and the like. Examples of magentas include, for example, 2,9-dimethyl-substituted quinacridone and anthraquinone dye identified in the Color Index as CI 60710, CI Dispersed Red 15, diazo dye identified in the Color Index as CI 26050, CI Solvent Red 19, and the like. Illustrative examples of cyans include copper tetra(octadecyl sulfonamido) phthalocyanine, x-copper phthalocyanine pigment listed in the Color Index as CI 74160, CI Pigment Blue, and Anthrathrene Blue, identified in the Color Index as CI 69810, Special Blue X-2137, and the like; while illustrative examples of yellows include diarylide yellow 3,3-dichlorobenzidene acetoacetanilides, a monoazo pigment identified in the Color Index as CI 12700, CI Solvent Yellow 16, a nitrophenyl amine sulfonamide identified in the Color Index as Foron Yellow SE/GLN, CI Dispersed Yellow 33 2,5-dimethoxy-4-sulfonanilide phenylazo-4'-chloro-2,5-dimethoxy acetoacetanilide, and Permanent Yellow FGL.

The wax composition may also contain additives, such as inorganic materials such as metal oxides as a moisture barrier and/or as light scattering agent. Illustrative examples of inorganic materials that may be used in the present disclosure include, for example, aluminum oxides, strontiates, tantalates, titanates, zirconates, silicon oxides, tantalum oxides, titanium oxides, silicon nitrides, barium titanate, and mixture thereof.

The wax composition may also contain crosslinking agents which can react after deposition to form a crosslinked layer of the wax composition. Illustrative examples of crosslinking agents include, for example, compounds containing two or more isocyanate groups, compounds containing two or more epoxy groups, compounds containing two or more carboxylic acid groups and acid anhydrides of carboxylic acid, compounds containing two or more vinyl groups, compounds containing two or more acrylates groups, and mixture thereof.

Each of the inorganic materials and the crosslinking components can be present, for example, in a suitable amount, such as from about 1 to about 20 weight percent.

Various suitable processes can be selected to form the wax encapsulation layer. In embodiments, the encapsulation layer can be deposited via liquid processing methods such as spin coating, dip coating, bar coating, ink jet printing, microcontact printing, stencil printing, and the like. Also, a solution of the wax composition in a suitable solvent can be applied to the device to form the encapsulating layer, and wherein the solvent can be selected from, but not limited to alcohols, such as methanol, ethanol, isopropanol, and butanol; toluene, xylene, tetrahydrofuran, dichloromethane, dichloroethane, chlorobenzene, dichlorobenzene, cyclohexane, hexane, heptane, octane and similar or other suitable solvents. In embodiments, the wax composition should have solubility in the solvent of, for example, from about 0.1 percent to 20 percent by weight, and also the solvent should have little or no effect on prior deposited layers. In embodiments, the encapsulation layer can also be deposited by printing the wax composition at melting state. For the melting deposition, the wax composition has, for example, a melting point of from about 60° C. to about 250° C., or from about 80° C. to about 20° C.

DESCRIPTION OF THE FIGURES

Figure 1:
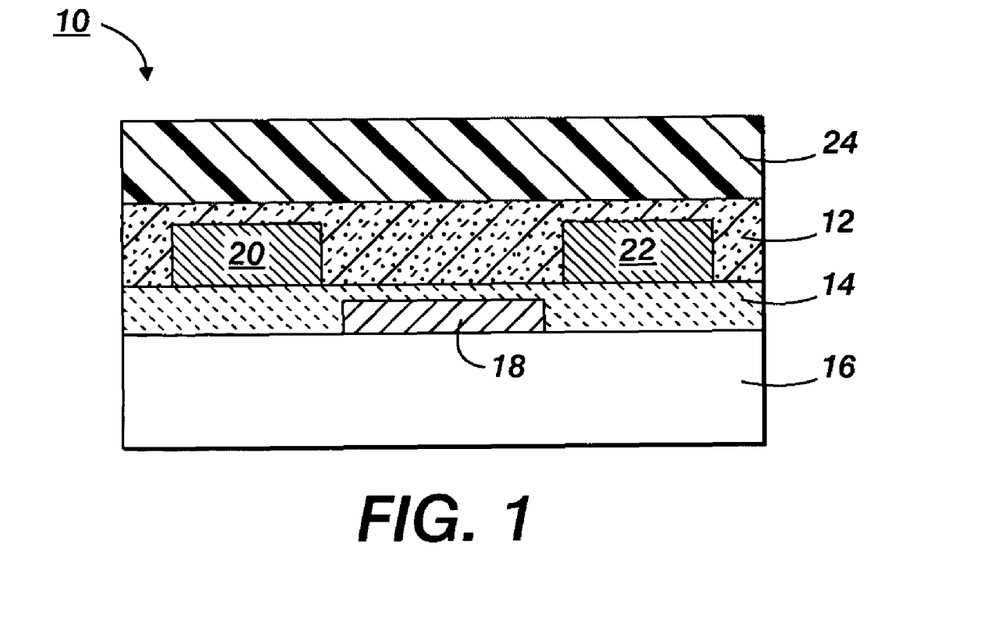

In FIG. 1 there is schematically illustrated a TFT configuration 10 comprised of a layer 16, of a heavily n-doped silicon wafer 18, which functions both as a substrate and a gate electrode; a thermally grown silicon oxide gate dielectric layer 14 on top of which layer there are deposited two metal contacts, 20 and 22 (source and drain electrodes). Over and between the metal contacts 20 and 22 is the semiconductor or active layer 12, and which layer can be comprised of various suitable components, such as the polythiophenes illustrated herein. The wax encapsulating layer 24 is deposited on and is in contact with layer 12.

Figure 2:
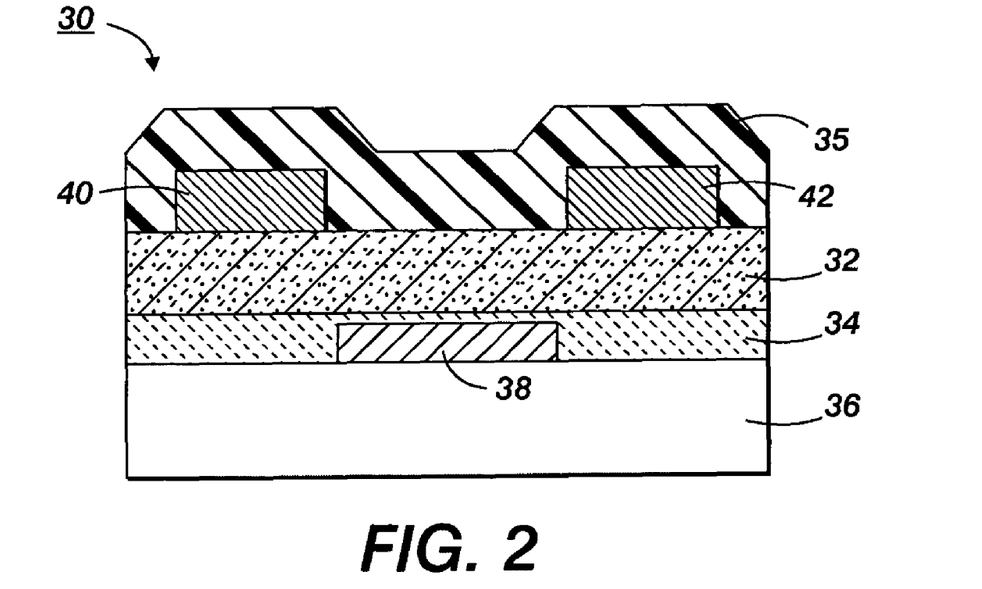

FIG. 2 schematically illustrates another TFT configuration 30 comprised of a substrate 36, a gate electrode 38, a source electrode 40, and a drain electrode 42, a gate dielectric layer 34, an organic semiconductor layer 32, and a wax encapsulating layer 35.

Figure 3:
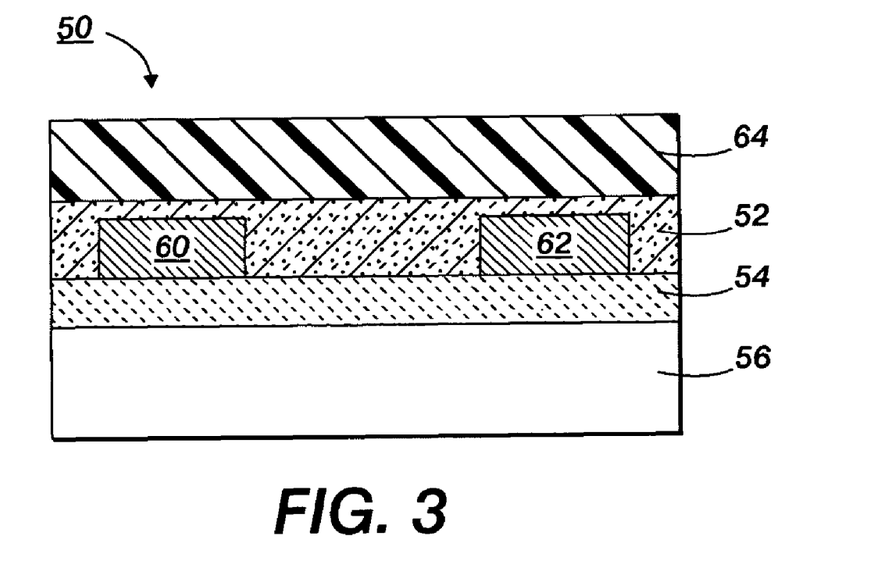

FIG. 3 schematically illustrates a further TFT configuration 50 comprised of a heavily n-doped silicon wafer 56, which functions as both a substrate and a gate electrode, a thermally grown silicon oxide dielectric layer 54, an organic semiconductor, such as a polythiophene as illustrated herein, layer 52, on top of which are deposited a source electrode 60 and a drain electrode 62; and wax composition encapsulating layer 64 in contact with layer 52.

Figure 4:
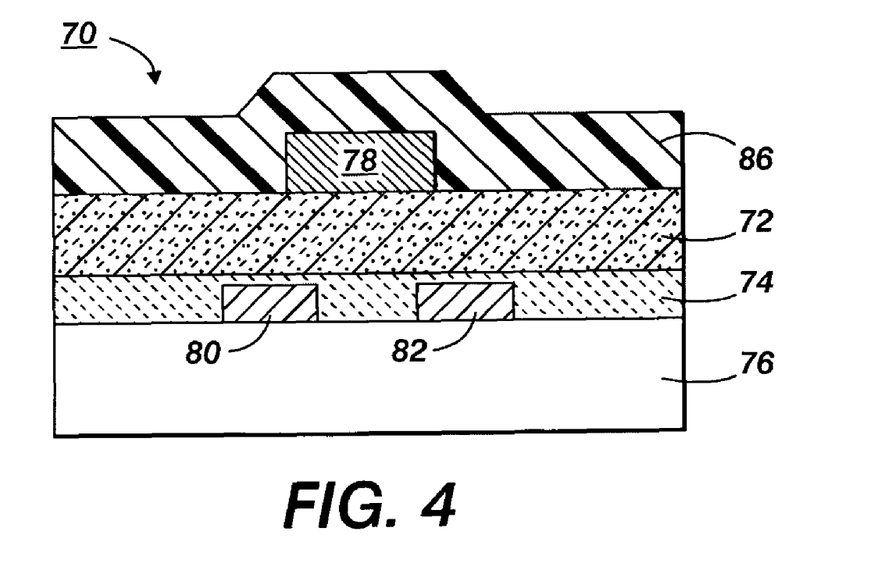

FIG. 4 schematically illustrates a TFT configuration 70 comprised of substrate 76, a gate electrode 78, a source electrode 80, a drain electrode 82, an organic semiconductive layer 72, an insulating dielectric layer 74, and wherein layer 72 is in contact with and encapsulated by a wax composition layer 86, and which wax layer is of a thickness, for example, of from about 1 to about 15 microns.

Also, other devices not disclosed, especially TFT devices, are envisioned, reference for example known TFT devices.

In embodiments and with further reference to the present disclosure and the Figures, the substrate layer may generally be a silicon material inclusive of various appropriate forms of silicon, a silicon wafer, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers especially for a flexible plastic substrate and from about 1 to about 10 millimeters for a rigid substrate such as glass or silicon.

The insulating dielectric layer, which can separate the gate electrode from the source and drain electrodes, and is in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer. Exemplary semiconductor materials include regioregular polythiophene, oligothiophene, pentacene, and the semiconductor polymers disclosed in U.S. Patent Application Publication No. 2003/0160230; U.S. Patent Application Publication No. 2003/0160234; U.S. Patent Application Publication No. 2003/0136958; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Various suitable processes may be used to form the semiconductor layer. One such method is to apply a vacuum of about $10^{-5}$ to $10^{-7}$ torr to a chamber containing a substrate and a source vessel that holds the semiconductor compound in powdered form, followed by heating the vessel until the compound sublimes onto the substrate. The semiconductor layer can also generally be fabricated by solution processes such as spin coating, casting, screen printing, stamping, or jet printing of a solution or dispersion of the semiconductor.

In an embodiment, the semiconductor layer comprised of polythiophenes illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of the polythiophenes of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG™ available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films, and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters, with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +10 volts to about −80 volts is applied to the gate electrode.

The encapsulation wax layer advantages are as illustrated herein and include specifically excellent moisture and oxygen barrier properties;

wax crystalline domains with a suitable size to permit the scattering of ambient light, thus preventing the light from reaching the semiconductor layer;

the pigment or dye-incorporated wax composition can be formulated to exhibit absorption for the entire visible spectrum, thus preventing photoinduced degradation of the semiconductor layer; and there can be selected soluble waxes which are jet-printable, and amenable to the roll-to-roll manufacturing process.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in U.S. Pat. No. 6,107,117, the disclosure of which is totally incorporated herein by reference.

Other known materials not recited herein for the various components of the TFT devices of the present disclosure can also be selected in embodiments.

The following Examples are provided.

GENERAL PROCEDURE a) Device Fabrication:

There was selected a top-contact thin film transistor configuration as schematically illustrated, for example, in FIG. 3.

The device was comprised of a n-doped silicon wafer with a thermally grown silicon oxide layer of a thickness of about 110 nanometers thereon. The wafer functioned as the gate electrode while the silicon oxide layer acted as the gate dielectric and had a capacitance of about 30 nF/cm² (nanofarads/square centimeter) as measured with a capacitor meter. The fabrication of the device was accomplished at ambient conditions without any precautions to exclude the materials and device from exposure to ambient oxygen, moisture, or light. The silicon wafer was first cleaned with isopropanol, air dried, then cleaned with an argon plasma and washed with distilled water and isopropanol. The cleaned substrates were immersed in a 0.1 M solution of octyltrichlorosilane in toluene for about 20 minutes at about 60° C.

The following polythiophene was used to fabricate the semiconductor layer where this polymer possessed a $M_w$ of 22,900 and $M_n$ of 17,300 relative to polystyrene standards. This polythiophene and its preparation are described in U.S. Patent Application Publication No. 2003/0160230, the disclosure of which is totally incorporated herein by reference. The semiconductor polythiophene layer of about 30 nanometers thick was deposited on top of the device by spin coating of the polythiophene in dichlorobenzene solution at a speed of 1,000 rpm for about 100 to about 120 seconds, and dried in vacuo at 80° C. for about 2 to about 10 hours. The semiconductor layer was then heated to about 130° C. to about 140° C. or about 10 minutes to about 30 minutes, then the resulting device was allowed to cool down to room temperature (about 23° C. to about 25° C.) gradually.

Thereafter, the gold source and drain electrodes were deposited on top of the semiconductor polythiophene layer by vacuum deposition through a shadow mask with various channel lengths and widths, thus creating a series of transistors of various dimensions.

POLYWAX 500™, selected as an encapsulant, was dissolved in heptane at a 0.3 percent by weight with heating to about 80° C. The hot solution was spin coated on top of the above generated devices at 1,000 rpm for 30 seconds resulting in 1 micron thin film after dried at 60° C. for 1 hour.

For consistency, the devices after fabrication were kept at ambient conditions before and after evaluation.

b) TFT Device Characterization:

The evaluation of field-effect transistor performance was accomplished in a black box at ambient conditions using a Keithley 4200 SCS semiconductor characterization system. The carrier mobility, μ, was calculated from the data in the saturated regime (gate voltage, $V_G$<source-drain voltage, $V_{SD}$) according to equation (1)

$$I_{SD}=C_i\mu(W/2L)(V_G-V_T)^2 \qquad (1)$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

Another property of the field-effect transistor is its current on/off ratio. This is the ratio of the saturation source-drain current when the gate voltage $V_G$ is equal to or greater than the drain voltage $V_D$ to the source-drain current when the gate voltage $V_G$ is zero.

COMPARATIVE EXAMPLE

TFT devices were fabricated according to the General Procedure above except that a wax encapsulation layer was not included. Then the devices were left in ambient light, oxygen and moisture to determine their stability. The performance from at least five transistors is summarized in Table 1.

TABLE 1

Stability of Organic Thin Film Transistors Without Encapsulation

| Days | Mobility (cm$^2$/V · s) | Current On/off ratio |
|---|---|---|
| 0 | 0.06-0.12 | $10^6$~$10^7$ |
| 15 | 0.003-0.005 | $10^2$~$10^3$ |

EXAMPLE I

A top-contact thin film transistor configuration as schematically illustrated, for example, in FIG. 3 was fabricated according to the General Procedure.

The devices were encapsulated with a POLYWAX 500™ as follows. POLYWAX 500™ was dissolved in heptane at a 0.3 percent by weight with heating to about 80° C. The hot solution was spin coated on top of the devices at 1,000 rpm for 30 seconds. After drying at 60° C., the devices were stored at the same conditions as the control devices. The performance characteristics from at least five of the resulting transistors are summarized in Table 2.

TABLE 2

Stability of Organic Thin Film Transistors With Wax Composition as Encapsulation Layer

| Time | Mobility (cm$^2$/V · s) | Current On/off ratio |
|---|---|---|
| 0 day | 0.06-0.12 | $10^6$~$10^7$ |
| 15 days | 0.05-0.10 | $10^6$~$10^7$ |
| 30 days | 0.04-0.09 | $10^6$~$10^7$ |
| 1 and half year (1.5) | 0.003 | $10^4$~$10^5$ |

Generally, the above data illustrates performance improvement and characteristics with a wax coating when two substantially identical thin film transistor devices fabricated with the same polythiophene semiconductor polymer, and wherein the comparative device was unprotected (Comparative Example), while the other devices were protected by a wax layer which was deposited by spin coating (Example I). The devices were exposed to ambient light, oxygen and humidity. There resulted performance degradation in the control devices or compositions as shown; mobility decrease by a factor of 20 in 15 days; and the current on/off ratio decreased by 4 orders of magnitude. In contrast, no significant degradation was observed for the wax protected devices. Also, the encapsulated wax devices exhibited excellent device performance for 1.5 years. After 1.5 years, the devices still evidenced mobility of 0.003 cm$^2$/V·s and current on/off ratio up to $10^4$ to $10^5$.

The stability of the devices with the wax encapsulants and the polythiophene semiconductor layer of the present disclosure was demonstrated, for example, by the high initial current on/off ratios and the slow reductions in the current on/off ratios of the devices.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. An electronic device comprising a substrate, a gate electrode, a source electrode, a drain electrode, a gate dielectric layer, a semiconductor layer, and an outermost encapsulating layer comprising at least one wax, wherein the device is a thin film transistor; and
wherein the gate electrode, source electrode, drain electrode, gate dielectric layer, and semiconductor layer are located between the substrate and the outermost encapsulating layer; and wherein the outermost encapsulating layer is in physical contact with the semiconductor layer.

2. A device in accordance with claim 1 wherein said wax is selected from the group comprised of natural vegetable waxes, natural animal waxes, mineral waxes, synthetic waxes, and functionalized waxes, and mixtures thereof.

3. A device in accordance with claim 2 wherein said natural vegetable waxes are selected from the group consisting of carnauba wax, candelilla wax, Japan wax, and bayberry wax, and mixtures thereof.

4. A device in accordance with claim 2 wherein said natural animal waxes are selected from the group consisting of beeswax, punic wax, lanolin, lac wax, shellac wax, and spermaceti wax, and mixtures thereof.

5. A device in accordance with claim 2 wherein said mineral waxes are selected from the group consisting of paraffin wax, microcrystalline wax, montan wax, ozokerite wax, ceresin wax, petrolatum wax, petroleum wax, and mixtures thereof.

6. A device in accordance with claim 2 wherein said synthetic waxes are selected from the group consisting of Fischer-Tropsch wax, acrylate wax, fatty acid amide wax, silicone wax, polytetrafluoroethylene wax, polyethylene wax, polypropylene wax, and mixtures thereof.

7. A device in accordance with claim 1 wherein said wax is a polyalkylene wax.

8. A device in accordance with claim 7 wherein said polyalkylene has an average molecular weight of from about 500 to about 25,000, and wherein the alkylene contains from 1 to about 20 carbon atoms.

9. A device in accordance with claim 7 wherein said polyalkylene is comprised of a mixture of polyethylene and polypropylene.

10. A device in accordance with claim 7 wherein said polyalkylene is a polyethylene.

11. A device in accordance with claim 7 wherein said polyalkylene is a polypropylene.

12. A device in accordance with claim 1 further containing in said encapsulating layer additives selected from the group consisting of at least one of pigments, dyes, metal oxides, crosslinking components, and mixtures thereof.

13. A device in accordance with claim 12 wherein the pigments or dyes are selected from the group consisting of black, cyan, magenta, yellow, red, green, brown, blue pigments and dyes, and mixtures thereof; said metal oxides are selected from the group consisting of aluminum oxides, strontiates, tantalates, titanates, zirconates, silicon oxides, tantalum oxides, titanium oxides, silicon nitrides, barium titanate, and mixtures thereof; and optionally wherein said crosslinking agents are selected from components containing two or more isocyanate groups, compounds containing two or more epoxy groups, compounds containing two or more carboxylic acid groups and acid anhydrides of carboxylic acid, compounds containing two or more vinyl groups, compounds containing two or more acrylates groups, and mixtures thereof.

14. A device in accordance with claim 1 wherein said wax possesses crystalline or semicrystalline characteristics.

15. A device in accordance with claim 1 wherein said semiconductor layer comprises a polythiophene.

16. A device in accordance with claim 1 wherein said semiconductor layer comprises a polythiophene of the formula (I)

wherein R represents a side chain; m represents the number of R substituents; A is a divalent linkage; x, y and z represent, respectively, the number of $R_m$ substituted thienylenes, unsubstituted thienylenes, and divalent linkages; A in the monomer segment subject to z being 0 or 1; and n represents the number of repeating monomer segments in the polymer or the degree of polymerization.

17. A device in accordance with claim 1 wherein said semiconductor layer is a polythiophene represented by (II)

wherein R is a side chain; a, b, c, and d represent the number of thienylene moieties; and n represents the degree of polymerization.

18. A thin film transistor comprising
a substrate;
a gate electrode;
a semiconductor layer;
a gate dielectric layer;
a source electrode;
a drain electrode;
and an outermost encapsulating layer thereover, the encapsulating layer comprising a wax and optional additives wherein the gate dielectric layer, the gate electrode, the semiconductor layer, the source electrode, and the drain electrode are in any sequence providing that said gate electrode and said semiconductor layer both contact the gate dielectric layer, and the source electrode and the drain electrode both contact the semiconductor layer;
wherein the gate electrode, source electrode, drain electrode, gate dielectric layer, and semiconductor layer are located between the substrate and the outermost encapsulating layer; and wherein the outermost encapsulating layer is in physical contact with the semiconductor layer.

19. A thin film transistor in accordance with claim 18 wherein the wax is a polyalkylene, and the semiconductor layer comprises a polythiophene.

20. A thin film transistor comprised of a substrate, an active polythiophene layer, and an outermost encapsulating layer which comprises a polyalkylene wax; wherein the active polythiophene layer is between the substrate and the outermost encapsulating layer; and wherein the outermost encapsulating layer is in physical contact with the active polythiophene layer.

* * * * *

UNITED STATES PATENT AND TRADEMARK OFFICE
CERTIFICATE OF CORRECTION

PATENT NO.       : 8,089,062 B2                                    Page 1 of 1
APPLICATION NO.  : 11/087881
DATED            : January 3, 2012
INVENTOR(S)      : Yiliang Wu et al.

It is certified that error appears in the above-identified patent and that said Letters Patent is hereby corrected as shown below:

In the Specification

Column 1, line 8, after "Cooperative Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*